United States Patent [19]
Kornfeld

[11] Patent Number: 5,426,392
[45] Date of Patent: Jun. 20, 1995

[54] SPREAD CLOCK SOURCE FOR REDUCING ELECTROMAGNETIC INTERFERENCE GENERATED BY DIGITAL CIRCUITS

[75] Inventor: Richard K. Kornfeld, San Diego, Calif.

[73] Assignee: Qualcomm Incorporated, San Diego, Calif.

[21] Appl. No.: 310,013

[22] Filed: Sep. 21, 1994

Related U.S. Application Data

[63] Continuation of Ser. No. 112,403, Aug. 27, 1993, abandoned.

[51] Int. Cl.⁶ .................. H03K 5/08; H03K 5/00; H03B 1/00
[52] U.S. Cl. .................... 327/551; 327/100; 327/309
[58] Field of Search ............... 307/260, 261, 268, 520, 307/555, 556; 328/14, 59; 327/100, 551, 309

[56] References Cited

U.S. PATENT DOCUMENTS

| | | | |
|---|---|---|---|
| 4,034,240 | 7/1977 | Foreman | 307/261 |
| 4,169,249 | 9/1979 | Hoffman et al. | 328/59 |
| 4,916,411 | 4/1990 | Lymer | 328/59 |
| 5,070,254 | 12/1991 | Summers | 307/261 |

*Primary Examiner*—William L. Sikes
*Assistant Examiner*—Fetsum Abraham
*Attorney, Agent, or Firm*—Russell B. Miller; Kenneth W. Bolvin

[57] ABSTRACT

In a digital circuit in which electromagnetic interference is generated at the fundamental and harmonic frequencies of the digital circuit clock source, a clock source for reducing the peak spectral content of said interference. The clock source includes a noise source for generating a broad band frequency noise signal and a filter circuit for receiving and bandpass filtering the noise signal and providing the filtered noise signal as the clock signal.

15 Claims, 4 Drawing Sheets

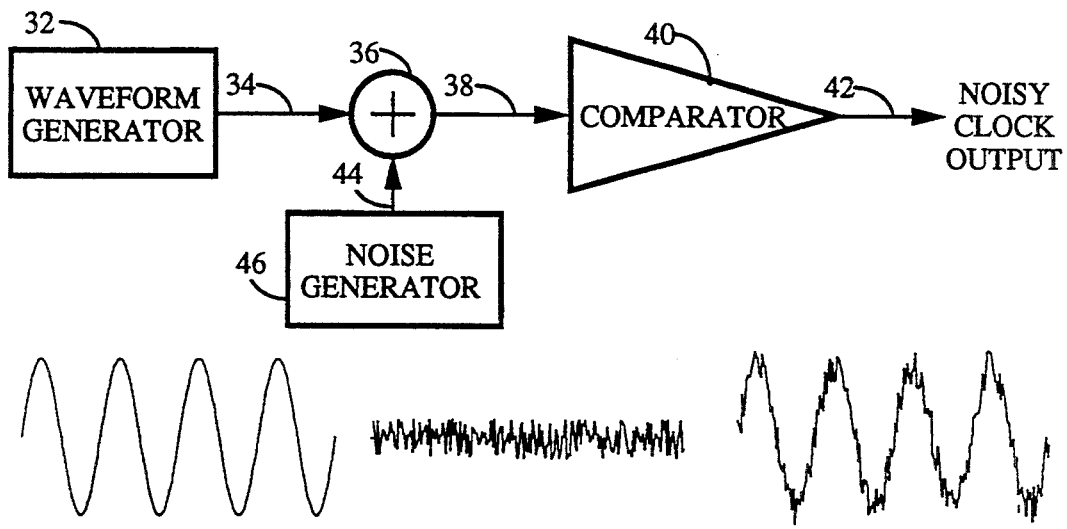
FIG. 4
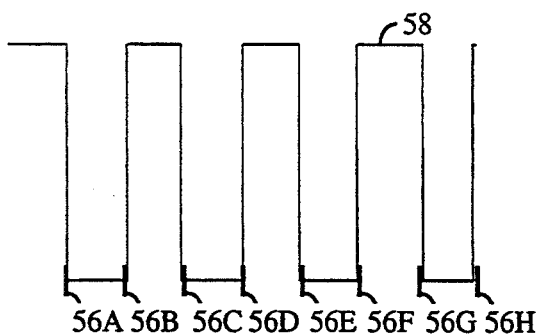
FIG. 5A    FIG. 5B    FIG. 5C
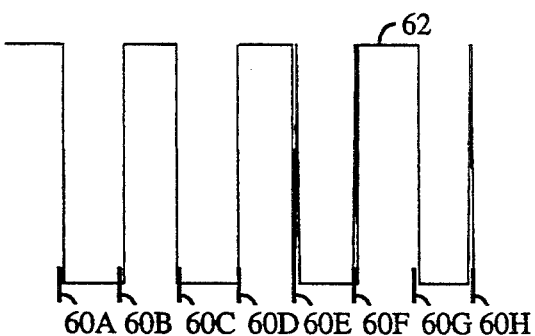
FIG. 5D    FIG. 5E
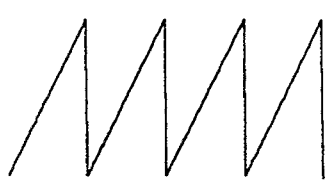
FIG. 6A    FIG. 6B    FIG. 6C
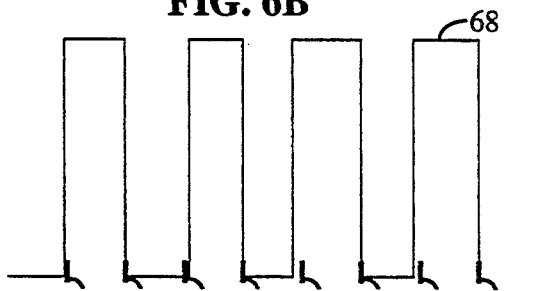
FIG. 6D : # SPREAD CLOCK SOURCE FOR REDUCING ELECTROMAGNETIC INTERFERENCE GENERATED BY DIGITAL CIRCUITS This is a continuation of application Ser. No. 08/112,403, filed Aug. 27, 1993, abandoned.

BACKGROUND OF THE INVENTION

1. Field of the Invention

The present invention relates to clock sources for digital circuits. More particularly, the present invention relates to a clock source for reducing electromagnetic interference of digital circuits that can be induced in analog or RF circuits.

2. Description of the Related Art

In modern electronic equipment that is composed of both high speed digital circuitry and highly sensitive analog or RF circuitry a problem of electromagnetic compatibility exists. In practice, the noise generated by high speed digital circuitry consists primarily of discrete high energy spurs located at the harmonics and sub-harmonics of the digital clock frequency. Although shielding and other similar techniques can reduce such interference, considerable efforts must be made to achieve such results.

Several techniques presently exist for reducing interference caused by spurious emissions of a frequency or clock source that involve reducing the energy of spurious emission by spreading the noise over a predetermined frequency spectrum. One such technique involves the use of a digital frequency synthesizer with digital logic, a sine look-up table, an amplitude dither circuit and a digital to analog converter, such as disclosed in U.S. Pat. No. 4,901,265 issued to the Assignee hereof. A synthesizer such as this is more applicable to cases where a clean sinusoidal waveform or modulated sinusoidal waveform is desired.

Another technique is disclosed in U.S. Pat. No. 4,410,954, where digital logic and registers are used to create a phase jittered output signal. The signal generated by such a device is a square wave that is particularly suited for digital circuit clock application. This circuit digitally generates a square wave signal in which successive cycles of the signal are of a periodicity jittered about a nominal periodicity. With a square wave signal of a fundamental frequency and harmonics associated therewith, the jittering of the signal results in a corresponding jittering of the fundamental frequency and associated harmonics.

Such frequency synthesizers are quite flexible in generating an output signal capable of being varied over a large band of frequencies and are effective at reducing peak spectral content of the noise. However due to their complexity and flexibility in frequency generation, such devices may cost more than what is necessary for applications where a constant clock frequency is desired. Furthermore, because both types of synthesizers require an input clock for operation, this clock input by itself may cause emissions of electromagnetic interference at the clock frequency by the digital synthesizer itself.

It is therefore an object of the present invention to provide a simple, low-cost clock source capable of providing a clock signal for digital circuits in which the peak spectral content of the spurious emissions of the clock source and digital circuitry is spread over a specified bandwidth at a reduced level.

SUMMARY OF THE INVENTION

The present invention is a novel and improved clock source for clocking digital hardware. In the present invention a clock source is disclosed which generates a square wave clock signal, and in doing so generates the clock signal in a manner that results in a substantial reduction of peak spectral content of interfering noise. In accordance with the present invention a clock is provided which comprises a noise source for generating a broad band frequency noise signal and a filter circuit for receiving and bandpass filtering said noise signal and providing a clock signal. An alternative method of the present invention is a series of embodiments that use a signal generator and a noise source to produce a noisy clock. The alternative method provides a greater ability control the characteristics of the output waveform.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIG. 4 illustrates an alternate embodiment in block diagram form to the noisy clock source which allows more flexibility in the characteristics of the output waveform;

FIGS. 5A–E illustrate a set of possible waveforms for circuit of FIG. 4;

FIGS. 6A–D illustrate an alternate set of possible waveforms for circuit of FIG. 4 causing variations of the noisy clock output;

DETAILED DESCRIPTION OF THE PREFERRED EMBODIMENTS

Figure 1:
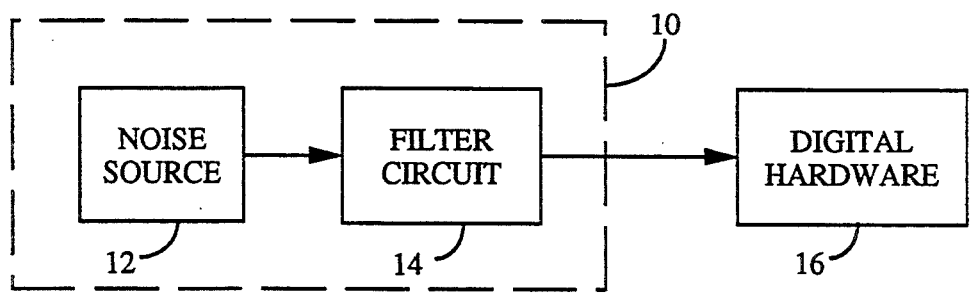
FIG. 1 is a block diagram of a noisy clock source of the present invention.

Referring now to the drawings, FIG. 1 illustrates in block diagram form an exemplary embodiment of the noisy clock source of the present invention. In FIG. 1, the noisy clock source 10 comprises noise source 12 and filter circuit 14. The output from circuit 14 is then provided to either digital hardware 16 or other digital components such as a processor.

Using noisy clock source 10, digital hardware 16 is generally asynchronous to other interfaced hardware. However within digital hardware 16 all functions are performed with respect to the clock frequency of noise source 10. Noisy clock source 10 phase modulates using noise, or spreads, the clock source signal to digital hardware 16 to reduce the peak spectral content of interfering noise generated by digital hardware 16. The maximum phase deviation, or in the time domain the peak edge jitter, is tightly controlled by a bandpass filter within circuit 14. This control is necessary to ensure that the maximum speed capability of the digital circuitry is not exceeded, and the minimum speed requirement of the circuitry is maintained.

Noise source 12 generates a random frequency component noise signal that is provided to circuit 14. Circuit 14 filters out-of-band frequency components from the noise signal to provide a clock signal within a narrow band of frequencies. The clock signal, typically a frequency varying sinusoidal signal, is then converted to the preferred square wave signal as a clock input to the digital hardware. With the clock signal varying in frequency, or jittering, a corresponding time domain variation in the period of the clock signal is also realized. This variation in the frequency/period of the clock signal results in different fundamental frequencies and corresponding harmonics and sub-harmonics for each different fundamental frequency.

As mentioned previously, a typical digital clock produces a square wave signal in which the harmonics and sub-harmonics occur at the multiples of the clock frequency. With the clock frequency remaining the same, the harmonics are at the same frequency each cycle. However, noisy clock source 10 by varying the clock signal period effectively spreads the undesirable frequency harmonics spurs over the frequency band because the harmonic frequency created by the clock varies over time. Thus the spurious signal energy at the nominal harmonic frequency is reduced and the energy is spread across the spectrum.

Figure 2:
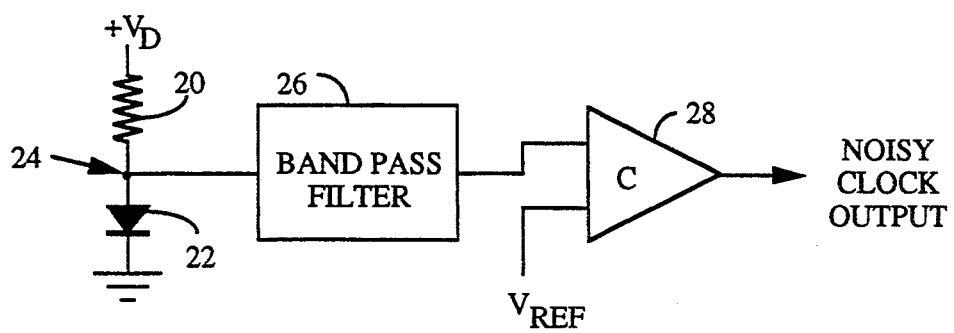
FIG. 2 is a schematical block diagram illustrating an exemplary implementation of the noisy clock source of FIG. 1.

FIG. 2 illustrates in further details an exemplary embodiment of noisy clock source 10 of FIG. 1. In FIG. 2 noise source 12 may be constructed by simply biasing a noise diode, a component well known in the art. As illustrated in FIG. 2, a bias voltage $+V_D$ is applied to one terminal of resistor 20 with the other terminal connected to the anode of noise diode 22 and the cathode of diode 22 is connected to ground. The noise signal, taken from node 24, is generated by biasing of diode 22. The input of bandpass filter 26 is coupled to node 24 with the output thereof coupled as one input to comparator 28. Bandpass filter may be constructed as either an active or passive filter arrangement as is well known in the art. Similarly, comparator 28 may also be constructed in many forms as is well known in the art, for example a simple op amp circuit that may include gain.

The noise signal generated by diode 22 is bandpass filtered by filter 26 that has a pass band corresponding in frequency to the desired period of the clock $T_c$. The pass band of filter 26 may be defined by the relationship:

$$T_{min} \leq T_c \leq T_{max} \tag{1}$$

where $T_{min}$ corresponds to the period of the maximum passband frequency $f_{max}$ and $T_{max}$ corresponds to the period of the minimum passband frequency $f_{min}$.

Comparator 28 receives at one input the filtered noise signal while receiving at another input a reference voltage $V_{REF}$. Comparator 28 converts the sinusoidal form of the noise signal into a square wave signal that is provided as noisy clock output.

Figure 3A:
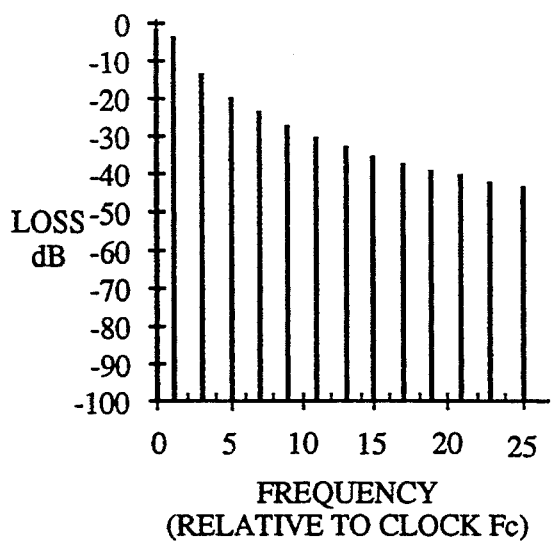
FIGS. 3a and 3b are diagrams respectively illustrating the emissions of a conventional clock source and a noisy clock source of the present invention.
Figure 3B:
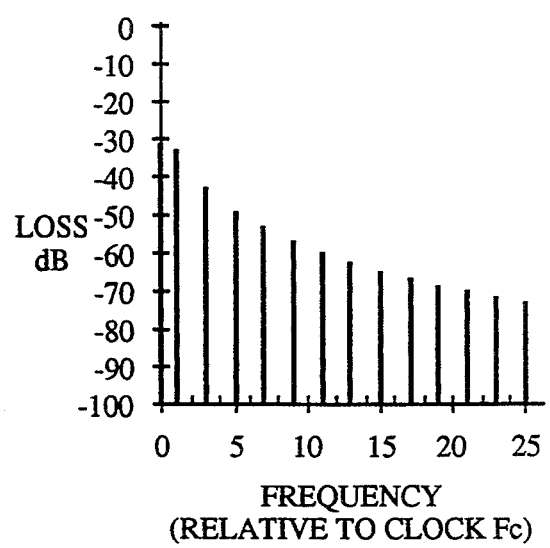

FIGS. 3a and 3b are diagrams respectively illustrating the emissions of a square wave with a 5% rise time for a conventional clock source and a noisy clock source of the present invention. FIGS. 3a and 3b illustrate the emission power at the clock signal output fundamental frequency Fc and the harmonic frequencies thereof. As can be seen from these diagrams the spurious emissions caused by a conventional clock source can be dramatically reduced at the fundamental frequency Fc and harmonics thereof using a noisy clock source.

It should be understood that the noisy clock source of the present invention may be implemented in various forms to achieve the same results. For example, as an alternative to the embodiment of FIG. 2, the basic block diagram of FIG. 1 could be implemented within a phase lock loop. Thus a noise source producing low frequency noise could be used to produce a noisy high frequency signal. An analog noise source could be injected in a phase lock loop at an appropriate point such as at the VCO input. The response of the phase lock loop would act as a filter for the noise thus limiting the bandwidth of the noise at the output of the loop.

FIG. 4 illustrates an alternate embodiment that allows more flexibility in the response of the circuit. Waveform generator 32 produces waveform 34 at the nominal frequency of the desired output clock. Noise generator 46 produces noise 44. Adder 36 adds noise 44 to waveform 34 to produce noisy waveform 38. Noisy waveform 38 is compared to a reference by comparator 40 to produce noise clock output 42. Comparator 40 has hysteresis so that noisy clock output 42 cycles high and low only once for each cycle of waveform 34. Noisy clock output 42 may take on a variety of different characteristics by varying the type of noise output by noise generator 46. For example, noise generator 46 may produce white noise, band limited noise, or Gaussian noise with a variety of parameters.

FIGS. 5A-E illustrate a set of possible waveforms for FIG. 4. FIG. 5A represents a sine wave corresponding to an exemplary waveform 34 of FIG. 4. FIG. 5B corresponds to an exemplary illustration of noise 44 which in this case has a maximum peak to peak amplitude equal to 25% of the maximum peak to peak amplitude of the sine wave of FIG. 5A. FIG. 5C represents the simple addition of FIG. 5A and 5B and corresponds to an exemplary noisy waveform 38 of FIG. 4. FIG. 5D illustrates the output of hysteresic comparator 40 given an input signal represented by FIG. 5C. Curve 58 represents the output signal and tick marks 56A–56H represent the location of the nominal transition time for the output signal in the absence of added noise. At tick mark 56D, curve 58 transitions at the nominal time. All other transitions shown happen before or after the nominal time. Note that due to the hysteresis in the comparator, only one rising and one falling edge occur on average per cycle. Curve 62 of FIG. 5E represents the waveform that would occur from the same noisy waveform signal that produced curve 58 of FIG. 5D if a comparator without hysteresis was employed. Note that at tick marks 60E, 60F, and 60H there are multiple transitions that can produce glitches on the output. In some particular cases, hysteresis may not be required if the ratio of the noise level is small compared to the transition time of the input waveform.

There are several advantages of the configuration of FIG. 4 as compared to FIG. 1. One such advantage is the ease of control of the output signal. By controlling the relative amplitude of the noise and waveform, the bandwidth of the jitter on the noisy clock output can be readily varied. In fact by adding an amplitude variation ability in either the waveform generator or the noise generator, the bandwidth of the jitter could be varied during the normal operation of the circuit.

By varying the type or shape of the waveform also causes variations of the noisy clock output. For example if an input triangle waveform is used, only one edge (either the rising or the falling) is jittered and the remaining edge is virtually constant. To illustrate the mechanism assume that the triangle wave of FIG. 6A corresponds to waveform 34 of FIG. 4 and that FIG. 6B corresponds to noise 44 which in this case has a maximum peak to peak amplitude equal to 25% of the maximum peak to peak amplitude of the triangle wave of FIG. 6A. FIG. 6C represents the simple addition of FIG. 6A and 6B and therefore corresponds to an exemplary noisy waveform 38 of FIG. 4. FIG. 6D illustrates the output of hysteresic comparator 40 given an input signal represented by FIG. 6C. Curve 68 represents the output signal and tick marks 66A-66H represent the location of the nominal transition time for the output signal in the absence of added noise. At tick marks 66B, 66D, 66F, and 66H, corresponding to each falling edge of curve 68, curve 68 transitions at the nominal time. All other transitions shown happen before or after the nominal time. Note that due to the hysteresis in the comparator, only one rising and one falling edge occur on average power cycle.

Figure 7:
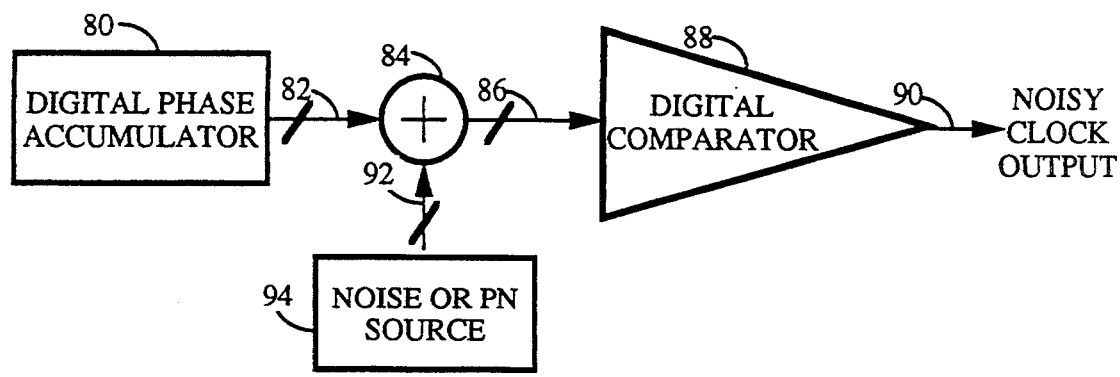
FIG. 7 illustrates an embodiment implemented with digital circuitry as an alternative to the noisy clock source of FIG. 4.

The generation method explained in the analog domain with FIGS. 4, 5, and 6 may also be implemented with digital circuitry. FIG. 7 illustrates a block diagram of one possible implementation. Digital phase accumulator 80 acts as the waveform generator in the analog system and produces multibit digital output value 82. Multibit digital output value 82 may represent any number of waveform patterns as discussed in conjunction with the analog implementation to achieve a variety of output waveforms. PN source 94 produces a random or flute length pseudo noise value 92. Pseudo noise value 92 is added to multibit digital output value 82 by adder 84. The number of bits of pseudo noise value 92 need not be the same as the number of bits of multibit digital output value 82 and a variety of schemes can be used to obtain the desired jitter at the output of the circuit. The adder produces noisy waveform value 86 that is compared to a reference in digital comparator 88 to produce noisy clock output 90. The digital noisy clock generator of FIG. 7 must be designed and implemented with care not to unwarily produce within the circuitry of itself the unwanted harmonic content that noisy clock output was chosen to eliminate.

Figure 8:
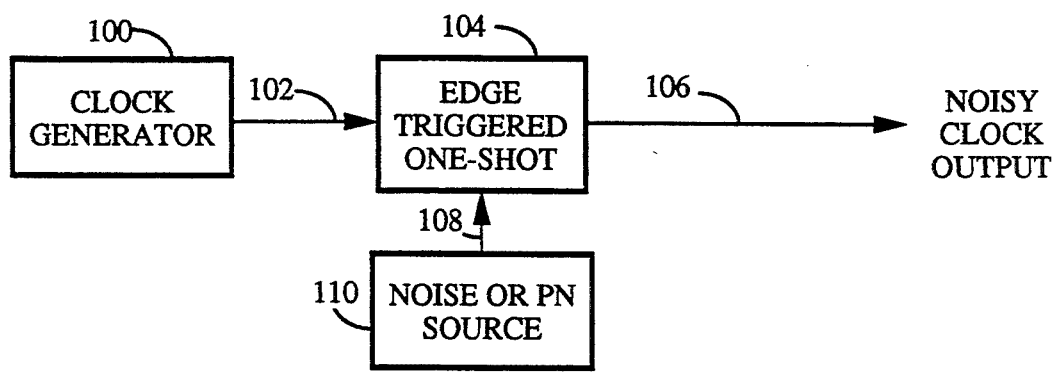
FIG. 8 illustrates an alternate digital embodiment of noisy clock source that eliminates multi-bit digital processing and the comparator of FIG. 7.

FIG. 8 illustrates an alternate embodiment of noisy clock generation that eliminates multi-bit digital processing and the comparator. Clock generator 100 produces single bit clock signal 102 at the desired nominal output frequency. Noise or pseudo random noise generator 110 produces noise value 108. Edge triggered one shot 104 receives clock signal 102 and noise value 108. Edge triggered one-shot 104 directly produces noisy clock output 106 by producing one rising edge output corresponding to the first rising edge of noise value 108 received after each rising edge of clock signal 102. The falling edge of noisy clock output is independent of the noise. Note that this method tends only to delay the rising edge of the output signal and not to advance the rising edge. The frequency at which noise value 108 changes determines the amount of jitter on the output. The higher the frequency of noise value 108 the less jitter present on noisy clock output 106 because the smaller average delay time between the rising edge of clock signal 102 and rising edge of noise value 108. A clock signal at a frequency higher than the nominal noisy clock output frequency could be used with an alternate type of one-shot. However because the purpose of the invention is to reduce the high frequency harmonics, in general the lowest possible clock signal is the most advantageous.

Figure 9:
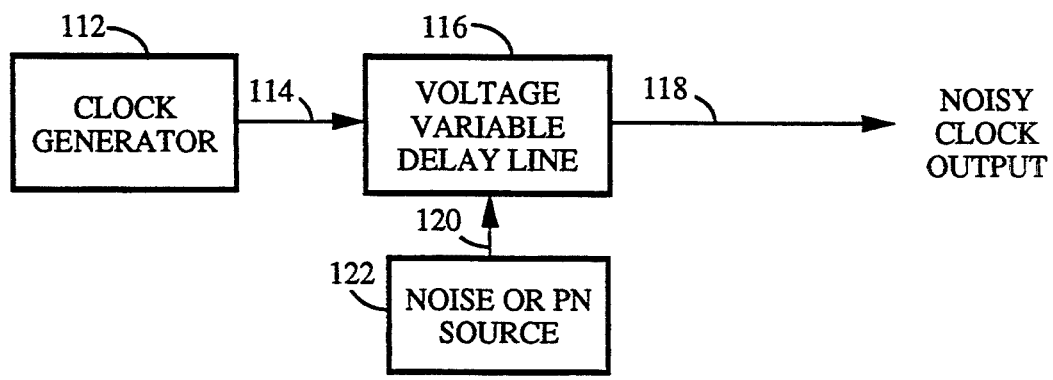
FIG. 9 illustrates an embodiment which uses a variable delay line to produce the jitter on the noisy clock output.

FIG. 9 illustrates an embodiment that uses a variable delay line to produce the jitter on the output noisy clock. Clock generator 112 produces digital clock signal 114 at the nominal output frequency of noisy clock output 118. Noise source 122 produces analog or digital noise signal 120. Voltage variable delay line 116 delays clock signal 114 according to noise signal 120 thus producing noisy clock output 118. Noisy clock output 118 contains only edges that have been delayed from nominal. The amount of jitter will depend on the maximum available delay of voltage variable delay line 116 and the maximum amplitude noise signal 120 in proportion to the total control range.

Figure 10:
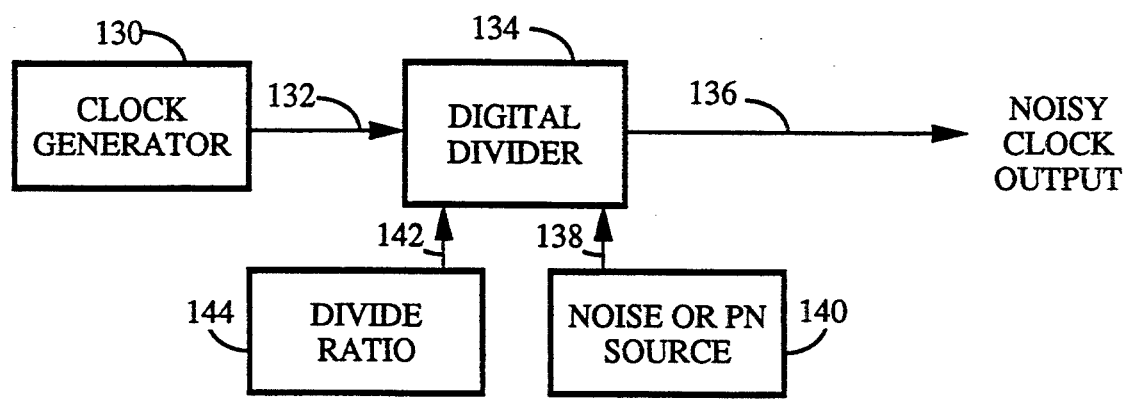
FIG. 10 illustrates an embodiment using a digital divider to the noisy clock output.

In some systems, an auxiliary circuit using a system clock is the primary producer of the offending harmonics. For example, some systems may need to divide the system clock to some lower frequency. The division process may comprise high speed digital circuits that can produce significant harmonic energy. To reduce the harmonic energy in such as case, the divisor ratio could be dithered to create a spread clock and to reduce the discrete harmonic energy created in the clock division process. FIG. 10 illustrates one such embodiment. FIG. 10 comprises clock generator 130 that provides input for digital divider 134. Digital divider 134 divides the incoming signal by a number set by divide ratio 144 and noise or pn source 138. For example divide ratio 144 may provide most significant digits 142 of the divide ratio and noise or pn source 138 may provide the least significant bits 138 thus providing a divide ratio that varies over time between two extremes. The time varying divide ratio produces noisy clock output 136.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A clock source, in a digital circuit, for generating a clock signal having noise modulated fundamental and harmonic frequencies, the clock signal having a reduced peak spectral content, the clock source comprising:

a noise diode having a first terminal coupled to a bias voltage and a second terminal coupled to a ground potential, the noise diode generating a noise signal in response to the bias voltage; and a bandpass filter having an input and an output, the input coupled to the first terminal, the bandpass filter filtering the noise signal such that the bandpass filter generates the clock signal at the bandpass filter output.

2. A clock source for generating a digital clock signal at a nominal frequency having a reduced discrete harmonic spectral content, the clock source comprising:

a waveform generator for providing a waveform at the nominal frequency;

a noise generator for generating a noise signal;

a summer, coupled to the waveform generator and the noise generator, for combining the waveform and the noise signal to produce a noisy waveform; and a comparator for providing the digital clock signal as a function of the noisy waveform as compared to a reference value.

3. The clock source of claim 2 wherein the waveform and the noise signal are both analog signals.

4. The clock source of claim 2 wherein the waveform has a controllable amplitude.

5. The clock source of claim 2 wherein the noise signal has a controllable amplitude.

6. The clock source of claim 2 wherein the waveform and the noise signal are both digital signals.

7. The dock source of claim 6 wherein the noise signal is a pseudo random code.

8. A clock source for generating a clock signal at a nominal frequency having a reduced discrete harmonic spectral content, the clock source comprising:

means for providing a digital signal at the nominal frequency;

single bit generation means for providing a randomly switching signal; and one-shot circuitry for providing the clock signal by providing an edge transition following each edge transition of the random switching signal which follows an edge transition of the digital signal.

9. A clock source for generating a clock signal at a nominal frequency having a reduced discrete harmonic spectral content, the clock source comprising:

means for providing a digital signal at the nominal frequency;

means for providing random signal generation; and a variable delay line for receiving the digital signal and delaying the digital signal in response to the random signal and providing the clock signal.

10. A clock source for generating a clock signal having a reduced discrete harmonic spectral content, the clock source comprising:

a clock generator circuit for generating an initial clock signal;

a noise source for generating a noise signal; and a digital divider, coupled to the clock generator and the noise source, for generating the clock signal from the initial clock signal in response to the noise signal and a predetermined divide ratio.

11. The clock source of claim 10 wherein the digital divider divides the initial clock signal by a divide number comprising the noise signal and the predetermined divide ratio.

12. The clock source of claim 11 wherein the noise signal provides the least significant bits of the divide number and the predetermined divide ratio provides the most significant bits of the divide number.

13. A clock source for generating a clock signal having a reduced discrete harmonic spectral content, the clock source comprising:

a clock generator circuit for generating an initial clock signal;

a pseudo noise source for generating a pseudo noise signal; and a digital divider, coupled to the clock generator and the pseudo noise source, for generating the clock signal from the initial clock signal in response to the pseudo noise signal and a predetermined divide ratio.

14. The clock source of claim 13 wherein the digital divider divides the initial clock signal by a divide number comprising the pseudo noise signal and the predetermined divide ratio.

15. The clock source of claim 14 wherein the pseudo noise signal provides the least significant bits of the divide number and the predetermined divide ratio provides the most significant bits of the divide number.

* * * * *